(12) United States Patent
Hasegawa et al.

(10) Patent No.: US 6,618,320 B2
(45) Date of Patent: Sep. 9, 2003

(54) SEMICONDUCTOR MEMORY DEVICE

(75) Inventors: Masatomo Hasegawa, Kawasaki (JP); Kaoru Mori, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/316,121

(22) Filed: Dec. 11, 2002

(65) Prior Publication Data

US 2003/0117885 A1 Jun. 26, 2003

Related U.S. Application Data

(63) Continuation of application No. PCT/JP01/03134, filed on Apr. 11, 2001.

(30) Foreign Application Priority Data

Jun. 26, 2000 (JP) ........................................ 2000-191760

(51) Int. Cl.[7] ................................................ G11C 8/00
(52) U.S. Cl. .................... 365/233; 365/233.5; 365/194; 365/189.05
(58) Field of Search ............................. 365/233, 233.5, 365/194, 189.05

(56) References Cited

U.S. PATENT DOCUMENTS

| | | | |
|---|---|---|---|
| 6,078,546 A | 6/2000 | Lee | 365/233 |
| 6,125,078 A | 9/2000 | Ooishi et al. | 365/233 |
| 6,185,149 B1 | 2/2001 | Fujioka et al. | 365/233 |
| 6,424,198 B1 * | 7/2002 | Wolford | 327/291 |
| 6,487,086 B2 * | 11/2002 | Ikeda | 361/772 |
| 6,532,525 B1 * | 3/2003 | Aleksic et al. | 711/168 |

FOREIGN PATENT DOCUMENTS

| | | |
|---|---|---|
| JP | A-10-269781 | 10/1998 |
| JP | A-2000-82287 | 3/2000 |
| JP | A-2000-163965 | 6/2000 |

OTHER PUBLICATIONS

International Search Report (in Japanese).
International Preliminary Examination Report (in Japanese).

* cited by examiner

Primary Examiner—Richard Elms
Assistant Examiner—Jung H. Hur
(74) Attorney, Agent, or Firm—Arent Fox Kintner Plotkin & Kahn, PLLC

(57) ABSTRACT

A semiconductor memory device is provided with a clock generation circuit that generates a first clock that has the same frequency and phase as an external clock, and a second clock that has the same frequency as the external clock but a phase a quarter phase shifted, and the first clock and the second clock are supplied to the two DDR-DRAMs as clocks so that the two DDR-DRAMs can operate in a state of being a quarter phase shifted from each other. A data output section outputs data respectively for time periods corresponding to a quarter phase from points a fixed phase behind the leading edge and the trailing edge of the first or the second clock and brings a data output circuit into a high impedance state for other time periods.

5 Claims, 9 Drawing Sheets

SEMICONDUCTOR MEMORY DEVICE

CROSS-REFERENCE TO RELATED APPLICATIONS

This application is based upon and claims priority of Japanese Patent Application No. 2000-191760, filed on Jun. 26, 2000, the contents being incorporated herein by reference, and a continuation of PCT/JP01/03134, filed Apr. 11, 2001.

TECHNICAL FIELD

The present invention relates to a semiconductor memory device. More particularly, the present invention relates to a semiconductor memory device that contains two double data rate (DDR) type dynamic random access memories (DRAMs) (DDR-DRAMS) in one package and the data input/output lines of the two DDR-DRAMs are commonly connected.

BACKGROUND ART

Recently, semiconductor memory devices, among which a DRAM is typical, are required to have an improved data transfer rate as well as to have an increased data capacity. To meet the demand, various new types of DRAMs, such as a synchronous DRAM that can realize a high data transfer rate, have been proposed. In an SDRAM, internal operations are carried out in synchronization with an external clock in a pipeline method, and data input/output are also carried out in synchronization with the external clock. It is, therefore, necessary to provide an external clock to an SDRAM.

In a conventional SDRAM, data is transferred in synchronization with the leading edge of a clock and, therefore, the data transferring cycle is the same as the clock cycle. Contrary to this, a double data rate (DDR) type DRAM (DDR-RAM) has been proposed, in which data can be transferred at double the rate compared to a conventional type, provided the same clock cycle is used, by transferring data in synchronization with both the leading edge and the trailing edge of the clock.

FIG. 1 is a block diagram that shows the basic structure of a DDR-DRAM. An external clock generation circuit 11 generates an internal clock ICLK or an output clock OCLK, and signals such as input timing signals with which address signals and control signals are read, from complementary clocks CLK and /CLK, and a clock enable signal CKE entered from the outside. A command decoder 12 receives and decodes control signals such as /CS, /RAS, /CAS, /WE and AP in synchronization with the input timing signals and supplies the decoded results to control signal latches 15-A, B, C and D, a mode register 16, and a data input/output portion 14. An address buffer 13 receives address signals A0 to A11 and bank select signals BA0 and BA1 and supplies them to the control signal latches 15-A, B, C and D, the mode register 16 and column address counters 17-A, B, C and D and at the same time supplies row addresses to DRAM cores 18-A, B, C and D. In the write mode, the data input/output portion 14 receives data DQ0 to n in synchronization with a data input/output timing signal DQS and supplies it to the DRAM cores 18-A, B, C and D. In the read mode, it outputs the data read from the DRAM cores 18-A, B, C and D as the data DQ 0 to n in synchronization with the output timing signal. The output timing signal is output as the data input/output timing signal DQS.

Among the control signal latches 15-A, B, C and D, the circuit that corresponds to the bank select signal from the address buffer 13 latches the control signal from the command decoder 12 and outputs RAS, CAS and WE to the corresponding DRAM core among 18-A, B, C and D. The mode register 16 controls so that column addresses that correspond to the column address counters 17-A, B, C and D are set in accordance with the mode specified according to the control signal from the command decoder 12 and the signal from the address buffer 13. The column address counters 17-A, B, C and D output column addresses, the number of which is equal to that of the addresses specified by the set column addresses, to the DRAM cores 18-A, B, C and D sequentially. The DRAM cores 18-A, B, C and D shown schematically have a four-bank structure and an activated bank writes the write data to be supplied to I/O in accordance with the control signals RAS, CAS, WE, the row address and the column address into the memory cell of the specified address in the write mode, and in the read mode, it supplies the data read from the memory address of the specified address to I/O. In an SDRAM such as a DDR-DRAM, as plural banks are accessed alternately, when data is read at, for example, 200 MHz, data is read from each bank at 100 MHZ and only the output section outputs data at 200 MHz.

As the DDR-DRAM is widely known, a further description is not given here. In the following description, although the output action of the read data is mainly described, the data write action can be described in the same way.

FIG. 2 is a time chart that shows the action in the data read mode in a conventional DDR-DRAM. As shown schematically, when it receives CLK indicated by the solid line and its complementary signal /CLK indicated by the dashed line as external signals, and a read command, the DDR-DRAM outputs first data Q1 in synchronization with the leading edge of CLK and outputs second data Q2 in synchronization with the leading edge of /CLK a half cycle behind, that is, the trailing edge of CLK. The two items of data Q1 and Q2 are, therefore, read during a cycle of the external clock CLK. Only one item of data was output during a cycle of the external clock CLK in synchronization with only the leading edge of the external clock CLK in the past, but if the cycle is the same as that of the external clock, it is possible for the DDR-DRAM to read twice as much data as a conventional SDRAM.

In the case of the data write action of the DDR-DRAM, as the write data changes in synchronization with the leading edge and trailing edge of the external clock CLK, the data is latched at a point where the write data becomes stable, for example, at a point a quarter cycle shifted from the leading edge or the trailing edge.

As described above, the DDR-DRAM is able to transfer data at double the conventional rate, provided the clock cycle is the same, but it is necessary to increase the speed of the clock and the internal action in order to further increase the data transfer rate. For example, if data is transferred at a frequency of 400 MHz, it is necessary to use a clock of 200 MHZ and each bank within the DRAM is required to operate at 200 MHz, even if the DDR method is adopted. A higher speed of a memory device has been achieved by reducing the design rule, the wiring resistance, the number of circuit stages, etc., but a physical limit relating to the electron speed or the like is close and it will be difficult to achieve a still higher speed by improving the conventional technologies for reducing the design rule, the wiring resistance, etc.

DISCLOSURE OF INVENTION

The present invention has been developed in order to break through the above-mentioned circumstances and the object of the present invention is to realize a semiconductor memory device that can increase only the data transfer rate while the clock speed and the internal action speed of a DDR-DRAM remain unchanged.

In order to realize the above-mentioned object, the semiconductor memory device of the present invention comprises two DDR-DRAMs within one package, which are commonly connected to data input/output lines, resulting in being integrated into one semiconductor memory device. Moreover, the semiconductor memory device is provided with a clock generation circuit that generates from external clocks a first clock whose frequency and phase are the same as those of the external clocks and a second clock whose frequency is the same as that of the external clocks but phase is shifted by a quarter phase, and the first clock and the second clock are supplied to the two DDR-DRAMs as clocks. As a result, the two DDR-DRAMs operate in a state of being a quarter phase shifted from each other. If the data output from each DDR-DRAM continues for a half cycle, a problem occurs that the outputs of the data from the two DDR-DRAMs overlap each other. In order to avoid this problem, the data output portion of the first DDR-DRAM outputs data for the time periods corresponding to a quarter phase from points a fixed phase behind the leading edge and the trailing edge, respectively, of the first clock, and the data output circuit is kept in a high impedance state for other time periods, and the data output portion of the second memory device outputs data for the time periods corresponding to a quarter phase from points a fixed phase behind the leading edge and the trailing edge, respectively, of the second clock, and the output circuit is kept in a high impedance state for other time periods. In this way, data collision in the read mode can be avoided. As data is written by only latching the data in the data input/output lines, the structure of a conventional DDR-DRAM can be used without any modification.

It is preferable that the first and the second DDR-DRAMs are provided on the same silicon substrate and both can be worked as two DDR-DRAMs that can operate independently. In general, the larger the area of a device, the higher is the probability of the occurrence of defects, in a semiconductor device. If, therefore, the first and the second DDR-DRAMs are the same size as the conventional ones, the probability of the occurrence of defects is increased accordingly, and the yield is decreased. In the case where the first and the second DDR-DRAMs can be worked as two DDR-DRAMs that can operate independently, even if one of them is defective, the other can be used as a DDR-DRAM whose capacity is half the conventional one. In this way, the substantial yield can be improved considerably.

Although the data input/output line of the semiconductor device is a single line formed on the silicon substrate, it is required that the data input/output lines of the first and the second DDR-DRAMs can be used independently when they are worked independently, therefore the data input/output line of the semiconductor device and those of the first and the second DDR-DRAMs are connected using bonding wires.

The clock generation circuit can be realized using a Delay Locked Loop (DLL) circuit.

As a signal that controls the data output circuits of the first and the second DDR-DRAMs can be easily generated by using the first and the second clocks, both the first and the second DDR-DRAMs are provided with both the first and second clocks, respectively.

BEST MODE FOR CARRYING OUT THE INVENTION

Figure 1:
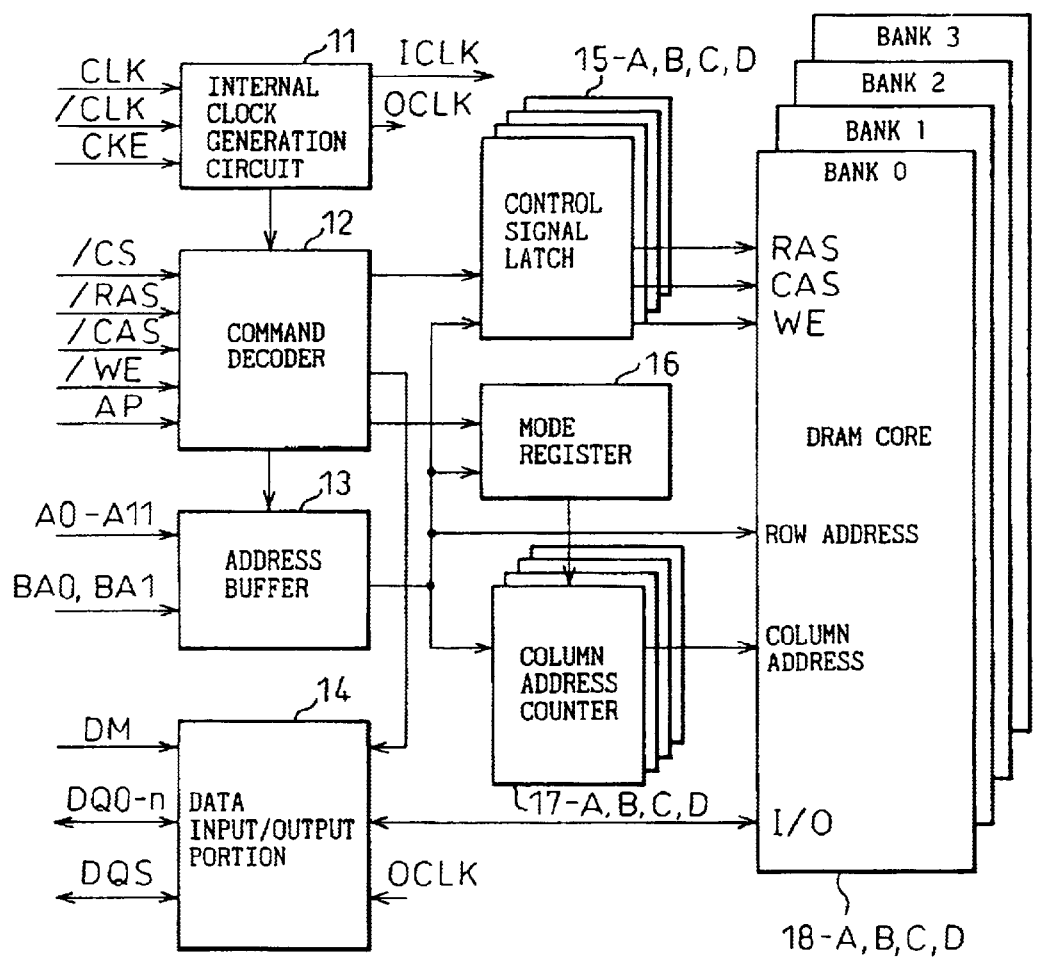
FIG. 1 is a block diagram of a DDR-DRAM.
Figure 2:
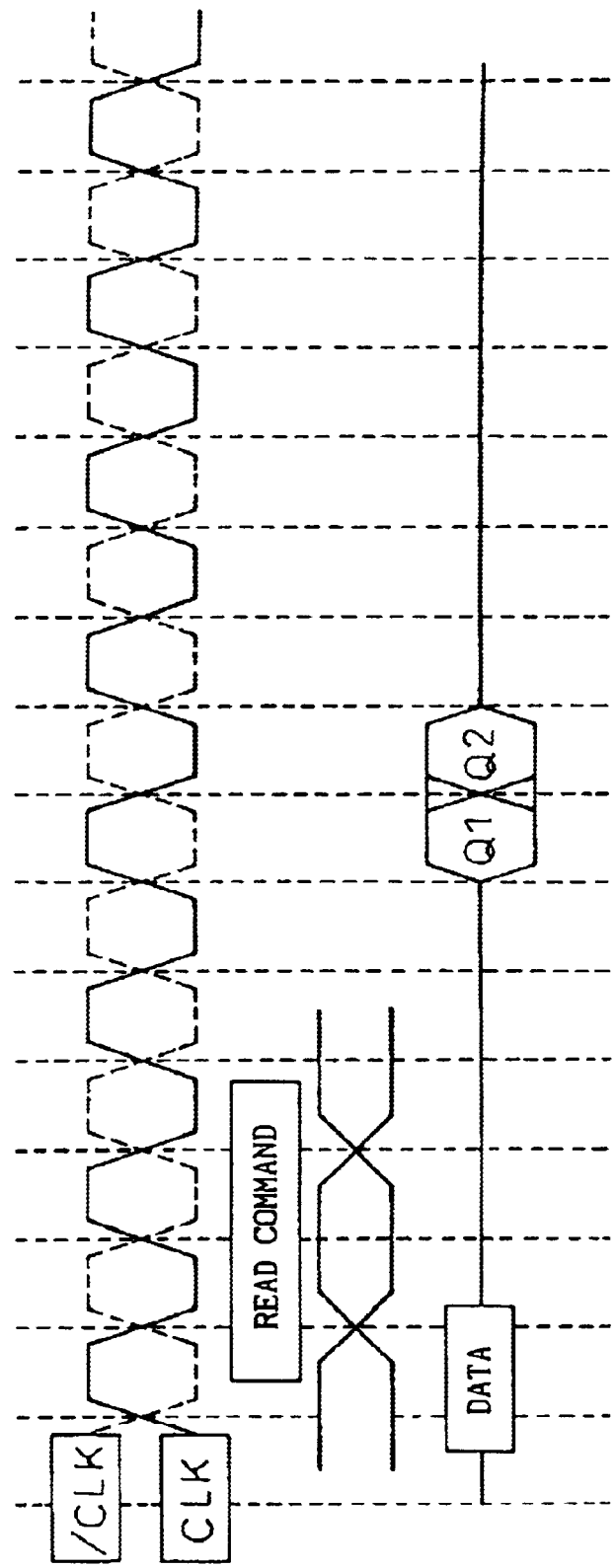
FIG. 2 is a time chart that shows the operation of a conventional DDR-DRAM.
Figure 3:
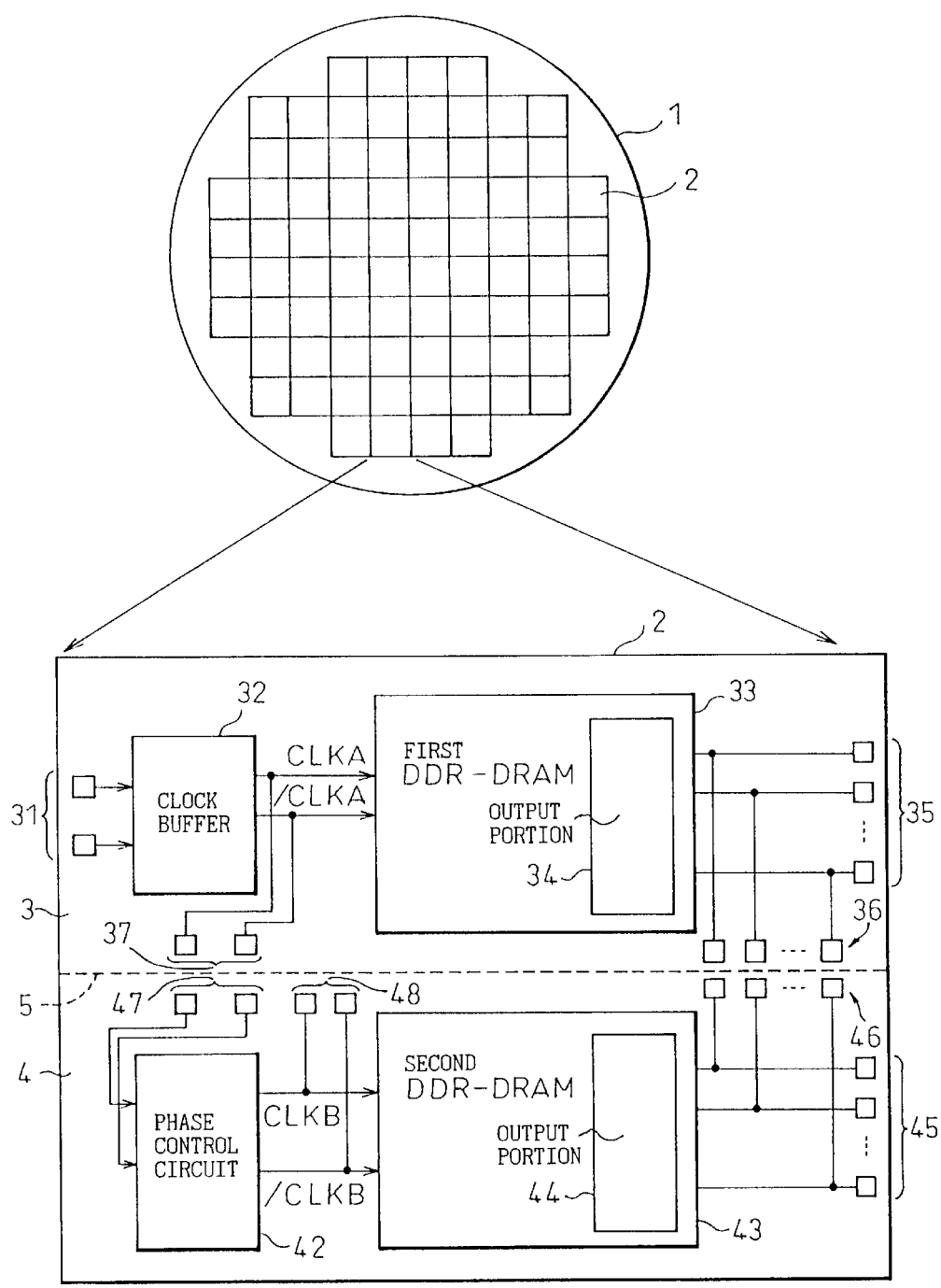
FIG. 3 is a diagram that shows the structure on a wafer of a memory device and its block diagram in a first embodiment of the present invention.

FIG. 3 is a diagram that shows the structure on the chip and a block diagram of the semiconductor memory device in the first embodiment of the present invention.

As shown schematically, a number of chips (dice) 2 are formed on a semiconductor wafer 1, an electric test is conducted after the chips are completed, and only non-defective ones are used for assembly after they are cut by a dicer. Each chip 2 is divided into a first part 3 and a second part 4 by a dashed line 5. The first part 3 is provided with a first DDR-DRAM 33, a clock buffer 32, input pads 31 of external clocks CLK and /CLK to be entered into the clock buffer 32, pairs of data output pads 35 and 36 of the first DDR-DRAM 33, and pads 37 that are connected to the signal lines of first clocks CLKA and /CLKA to be supplied from the clock buffer 33 to the first DDR-DRAM 33. In addition, pads to which control signals, address signals, etc., are sent are provided, but they are not shown schematically.

The second part 4 is provided with a second DDR-DRAM 43, a phase control circuit 42, pads 47 for clocks to be sent to the phase control circuit 42, pairs of data output pads 45 and 46 of the second DDR-DRAM 43, and pads 48 that are connected to the signal lines of second clocks CLKB and /CLKB to be supplied from the phase control circuit 42 to the second DDR-DRAM 43. In addition, pads to which control signals, address signals, etc., are sent are provided, but they are not shown schematically.

When the chip is cut along the dashed line 5 and the first DDR-DRAM 33 and the second DDR-DRAM 43 are assembled independently as separate chips, it is arranged that the clock buffer 32 and the phase control circuit 42 are not supplied with power, the pads 37 and 48 are supplied with the external clocks, respectively, and the pads, to which control signals and address signals are sent, are supplied with corresponding signals, respectively. Either one of the data output pads 35 and 36, and either one of the data output pads 45 and 46 are used as data output pads. In this way, the first DDR-DRAM 33 and the second DDR-DRAM 43 can be used as separate chips.

When the chip 2 is assembled as one chip, it is arranged as follows: the pads 37 and the pads 47 are connected correspondingly, and the pads 37 and the pads 47 are also connected correspondingly; the pads 31 are supplied with the external clocks CLK and /CLK, and the pads 48 are not connected; as an output data pad, either one of the pads 35 and 45 is used; and the pads in the first and the second parts 3 and 4, into which control signals and address signals are entered, are supplied with corresponding signals, respectively.

The clock buffer 32 generates the first clocks CLKA and /CLKA on receiving the external clocks CLK and /CLK supplied from the pads 31, and supplies them to the first DDR-DRAM 33 and the pads 37. The phase control circuit 42 generates the second clocks CLKB and /CLKB a quarter phase (90°) behind the first clocks CLKA and /CLKB supplied from the pads 37 and 47, and supplies them to the second DDR-DRAM 43. In this way, the first DDR-DRAM 33 and the second DDR-DRAM 43 perform the internal operation in synchronization with the first clock CLKA and the second clock CLKB, respectively, that is, in a state of being a quarter phase shifted. The phase control circuit 42 comprises, for example, a circuit that can divide the first clocks CLKA and /CLKA and take out a signal an arbitrary amount of phase behind and a delay device that can adjust the amount of delay by which the first clock CLKA and /CLKA are delayed, and sets the amount of delay so that the clocks CLKA and /CLKA are delayed by a quarter phase (90°).

Figure 4:
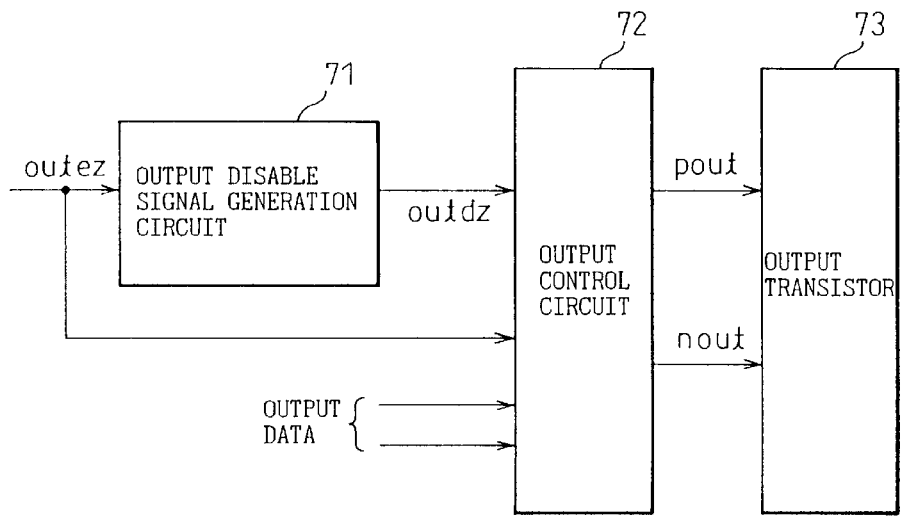
FIG. 4 is a block diagram that shows the structure of the output portion of each DDR-DRAM of the memory device in embodiments.
Figure 5:
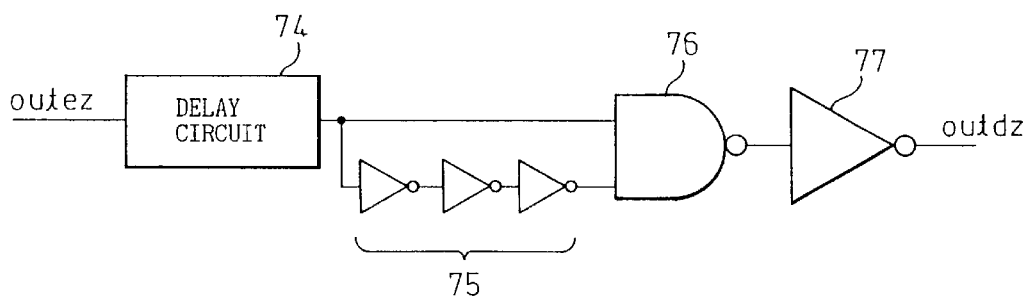
FIG. 5 is a diagram that shows an output disable signal generation circuit.
Figure 6:
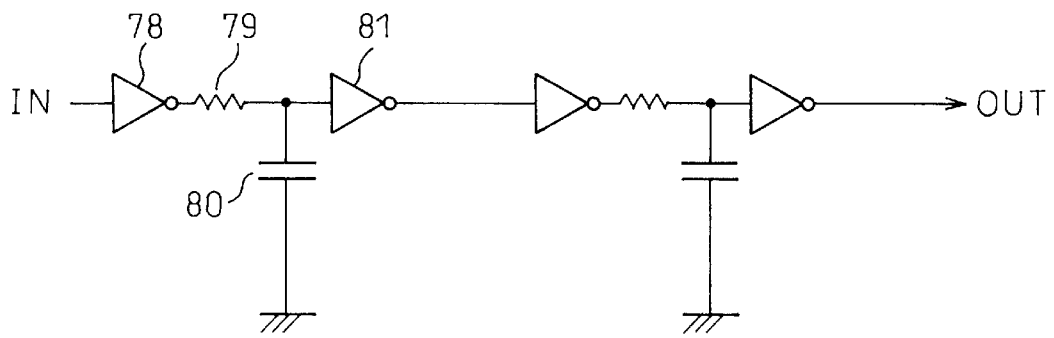
FIG. 6 is a diagram that shows an example of a delay circuit used in the output disable signal generation circuit.
Figure 7:
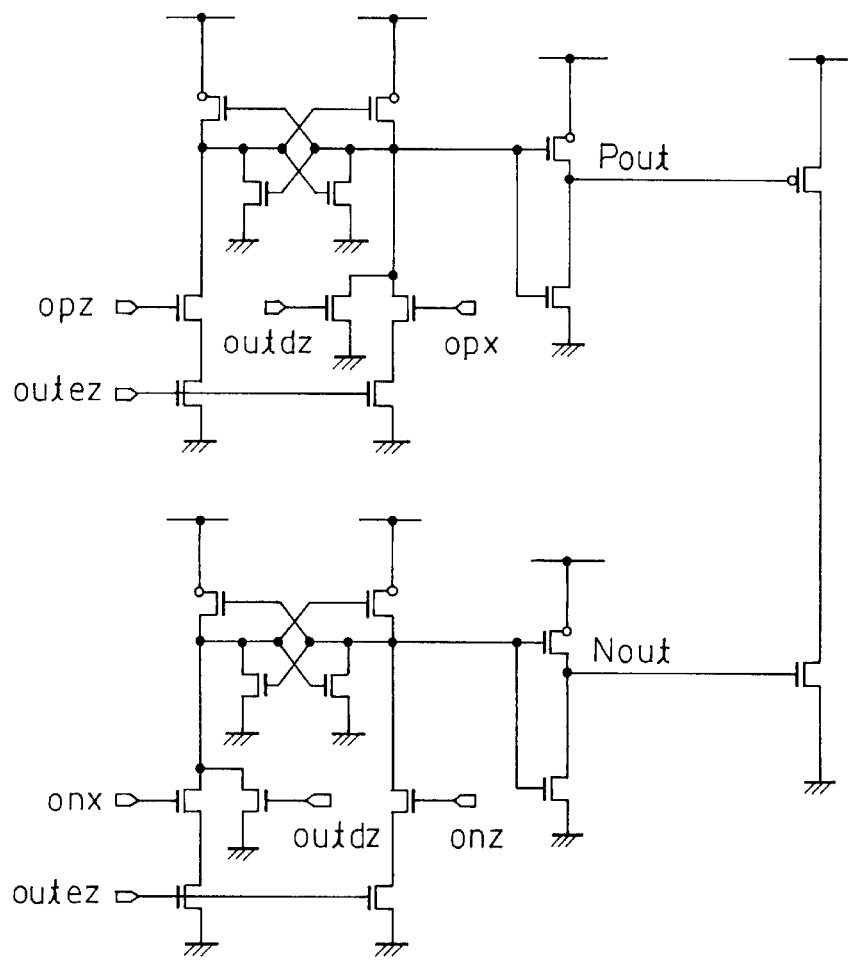
FIG. 7 is a diagram that shows the structure of the output control circuits and the output transistors of each DDR-DRAM of the memory device in the embodiments.

FIG. 4 is a block diagram that shows the structure of the data output portions 34 and 44 provided within the first DDR-DRAM 33 and the second DDR-DRAM 43, respectively. FIG. 5 is a diagram that shows the structure of an output disable signal generation circuit 71. FIG. 6 is a diagram that shows an example of the structure of a delay circuit 74 used in the output disable signal generation circuit 71. FIG. 7 is a diagram that shows the structure of an output control circuit 72 and an output transistor 73.

As shown in FIG. 5, the data output portion comprises the output disable signal generation circuit 71, the output control circuit 72 and the output transistor 73. In a conventional DDR-DRAM, an output signal outez is supplied to an output control circuit to control output. In the present embodiment, the output disable signal generation circuit 71, which generates an output disable signal outdz from the output signal outez, is newly provided, and the output portion of the present embodiment has the same structure as that of a conventional DDR-DRAM except that part of the output control circuit 72 is controlled by the output disable signal outdz.

As shown in FIG. 5, the output disable signal generation circuit 71 comprises the delay circuit 74 that delays the output signal outez by a fixed amount, a series of inverters 75 that set the pulse width of the output disable signal outdz, a NAND gate 76 and an inverter 77. As shown in FIG. 6, the delay circuit 74 is composed of delay devices, consisting of an inverter 78, a resistor 79, a capacitor 80 and an inverter 81, being connected in series, wherein an input IN is delayed in each stage and it is possible to select the amount of delay by taking it out from a suitable stage. In the output disable signal generation circuit 71 shown in FIG. 5, the output disable signal outdz is generated and it rises at a point a fixed amount behind the leading edge of the output signal outez and has a pulse with a fixed width.

The output control circuit 72 and the output transistor 73 have a structure as shown in FIG. 7. This circuit has a structure similar to the output portion of a conventional DDR-DRAM and differs only in that a transistor, to which the output disable signal outdz is applied, is provided additionally. By the application of the output disable signal outdz, the signal Pout to be applied to the gate of a P-channel output transistor becomes "high (H)", and the P-channel output transistor enters an off state. In addition, the signal Nout to be applied to the gate of an N-channel output transistor becomes "low (L)", and the N-channel output transistor also enters an off state. The output, therefore, enters a high impedance state.

Figure 8:
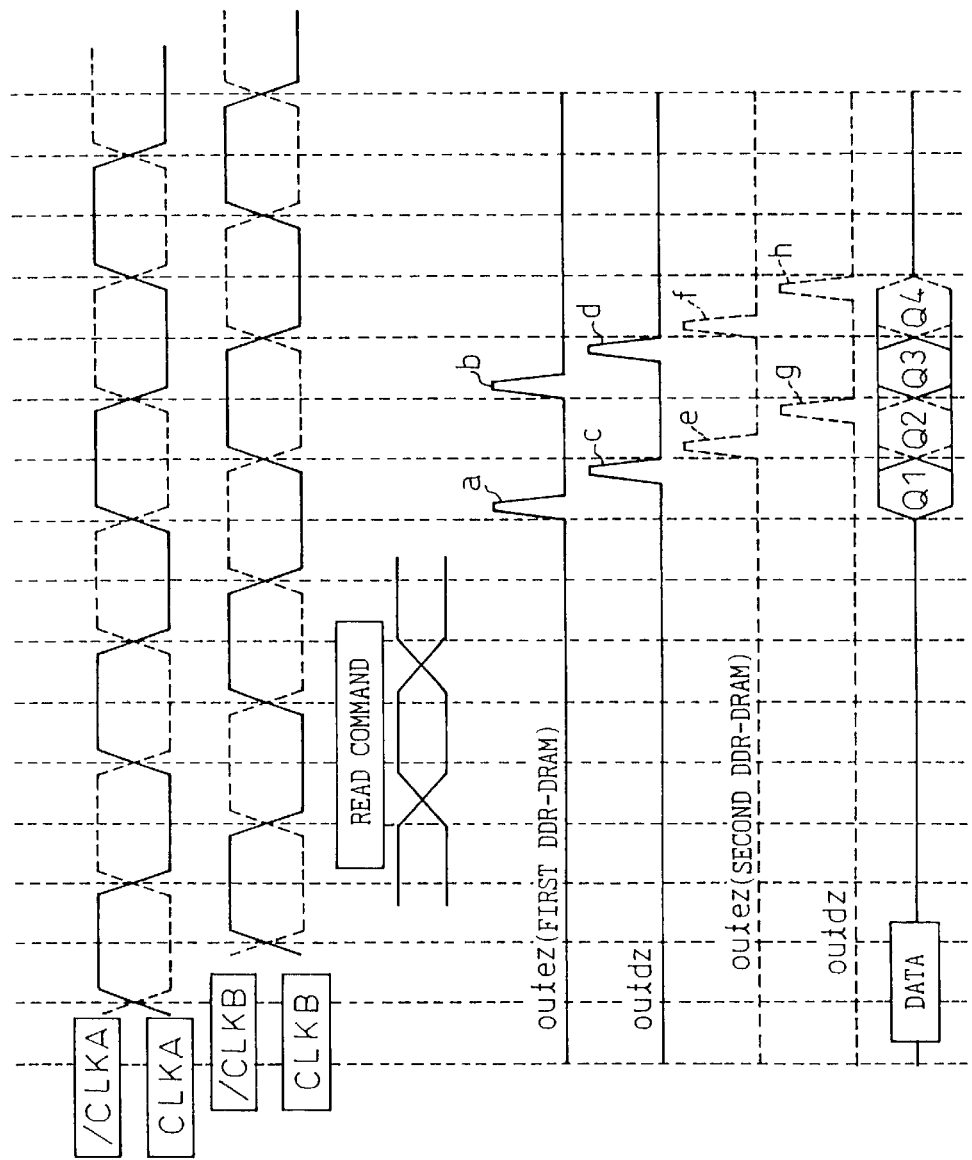
FIG. 8 is a time chart that shows the operation in the embodiments.

FIG. 8 is a time chart that shows the operation of the semiconductor memory device in the present invention. As shown in FIG. 4, CLKA and /CLKA are the complementary clocks, and CLKB and /CLKB are signals generated by delaying CLKA and /CLKA by a quarter phase (90°), respectively. In this way, the first DDR-DRAM 33 and the second DDR-DRAM 43 perform the internal operation in synchronization with the first clock CLKA and the second clock CLKB, respectively, that is, in a state of being shifted by a quarter phase of the clock. The first DDR-DRAM 33 and the second DDR-DRAM 43 accept control signals such as a read command at the leading edges of the first clock CLKA and the second clock CLKB, respectively, therefore, the control signals are made to extend two clock leading edges. A row address signal is entered from the pad to which an address signal is applied during the active operation, and a column address is applied during the later operation.

In the read action, for example, when a read command is issued, the memory cell of the address specified by an address signal is accessed, the stored data is read and amplified by an internal data bus amplifier, and is supplied to the output control circuit 72. The output signal outez of the first DDR-DRAM 33 has a pulse a that rises at the leading edge and a pulse b that rises at the trailing edge of CLKA. These are the same as before. The output signal outez of the second DDR-DRAM 43 has a pulse e that rises at the leading edge and a pulse f that rises at the trailing edge of CLKB. These are also the same as before.

The output disable signal generation circuit of the first DDR-DRAM 33 generates two pulses c and d, which are the pulses a and b delayed by a fixed amount, and outputs them as the output disable signal outdz. The pulses c and d are pulses that rise before the leading edge and the trailing edge of CLKB. Similarly, the output disable signal generation circuit of the second DDR-DRAM 43 generates two pulses g and h, which are the pulses e and f delayed by a fixed amount, and outputs them as the output disable signal outdz. The pulses g and h are pulses that rise before the leading edge and the trailing edge of CLKA.

The first DDR-DRAM 33 outputs data Q1 according to the pulse a and brings its output into a high impedance state when CLKB rises according to the pulse c. The second DDR-DRAM 43 outputs data Q2 according to the pulse e and brings its output into a high impedance state when CLKA falls according to the pulse g. Next, the first DDR-DRAM 33 outputs data Q3 according to the pulse b and brings its output into a high impedance state when CLKB falls according to the pulse d. The second DDR-DRAM 43 outputs data Q4 according to the pulse f and brings its output into a high impedance state when CLKA rises according to the pulse h. In this way, the four items of the output data of the first DDR-DRAM 33 and the second DDR-DRAM 43 are output without collision during one cycle of the clock. If, therefore, the clock is assumed to be 100 MHz, the data rate is 400 MHZ. In this case, each DDR-DRAM outputs data at a data rate of 200 MHZ and the internal operation is carried out at 100 MHz as a result. This means that the allowable range of delay time in the internal circuits can be extended and such an internal timing margin can also be extended compared to a conventional equivalent DDR-DRAM that operates at a data rate of 200 MHz.

In the write action, as before, the first DDR-DRAM 33 and the second DDR-DRAM 43 generate latch pulses with a fixed phase at intervals of half cycle in accordance with both the edges of CLKA and CLKB, respectively. As CLKA and CLKB are a quarter cycle shifted from each other, the latch pulses are alternately generated at quarter cycle intervals. Write data is supplied to the common data line at quarter cycle intervals, therefore, the write data is latched alternately by the latch pulses and written into the memory cell.

Figure 9:
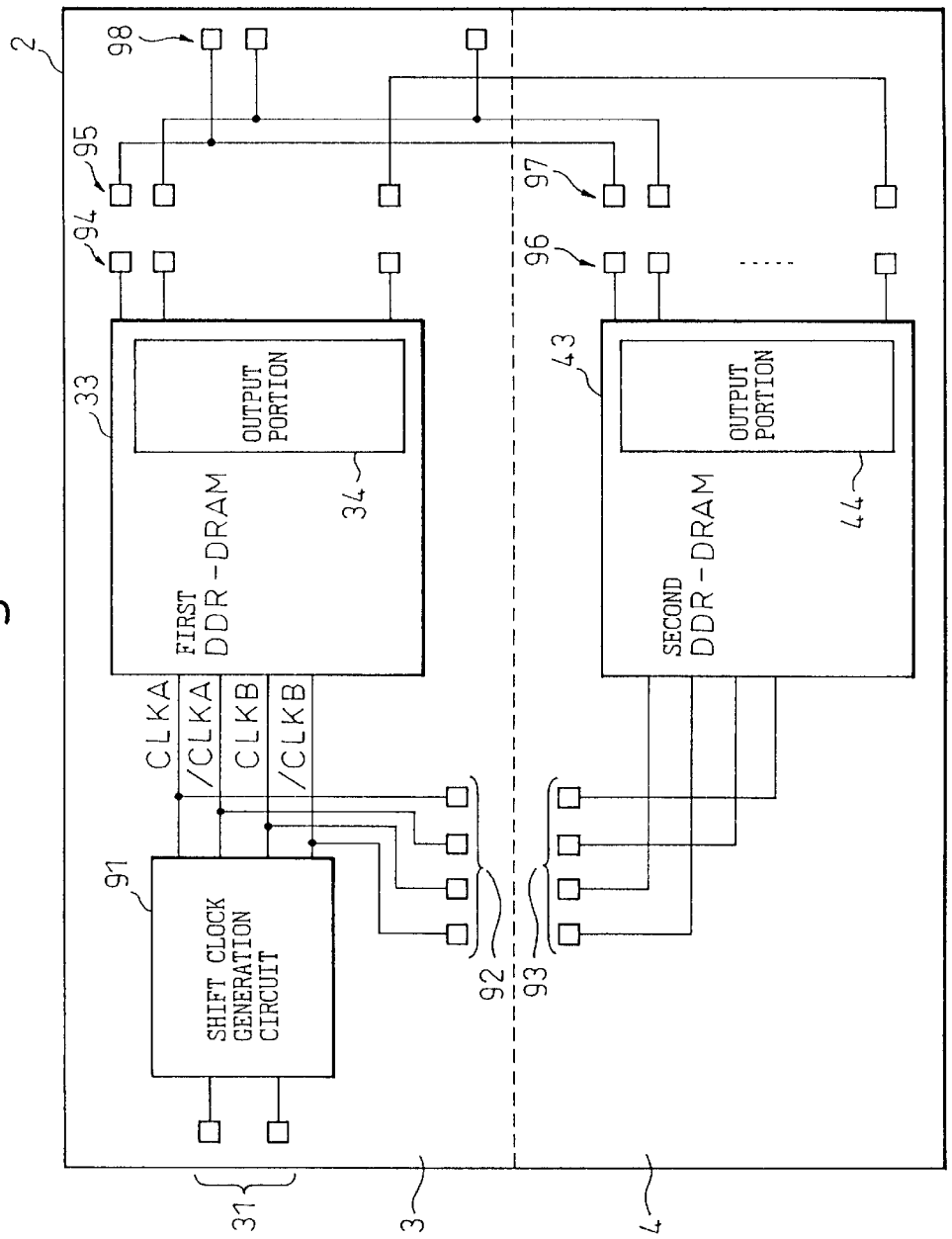
FIG. 9 is a diagram that shows the block structure of a memory device in a second embodiment of the present invention.

FIG. 9 is the block diagram of the memory device in the second embodiment of the present invention. This differs from that in the first embodiment in that: a shift clock generation circuit 91 is provided instead of the clock buffer 32 and the phase control circuit 42, in which four clocks CLKA, /CLKA, CLKB and /CLKB, the cycles of which are the same as the external clock but the phases of which are delayed by a quarter phase (90°) sequentially between neighboring clocks, are generated and are supplied to the first DDR-DRAM 33 and the second DDR-DRAM 43; and the output portions 34 and 44 of the first DDR-DRAM 33 and the second DDR-DRAM 43 generate the output signal outez and the output disable signal outdz from the four clocks. In addition, the pads that supply clocks and the data output pads are also different from those in the first embodiment.

When the first and the second parts 3 and 4 are divided to assemble the first DDR-DRAM 33 and the second DDR-DRAM 43 as separate chips, it is arranged as follows: the shift clock generation circuit 91 is not supplied with power; the external clocks are supplied to pads among pads 92, which are connected to the signal lines of CLKA and /CLKA; the external clocks are supplied to pads among pads 93, which are connected to the signal lines of CLKB and /CLKB; and data output pads 94 and 96 are used. In this way, the first DDR-DRAM 33 and the second DDR-DRAM 43 can be used as separate chips.

When the chip 2 is assembled as one chip, it is designed as follows: the corresponding pads 92 and 93 are connected and the corresponding pads 94 and 95, and the corresponding pads 96 and 97 are connected; the pad 31 is supplied with the external clocks CLK and /CLK; and the pads, into which the control signals or address signals in the first and the second parts 3 and 4 are entered, are supplied with the corresponding signals, respectively.

Figure 10:
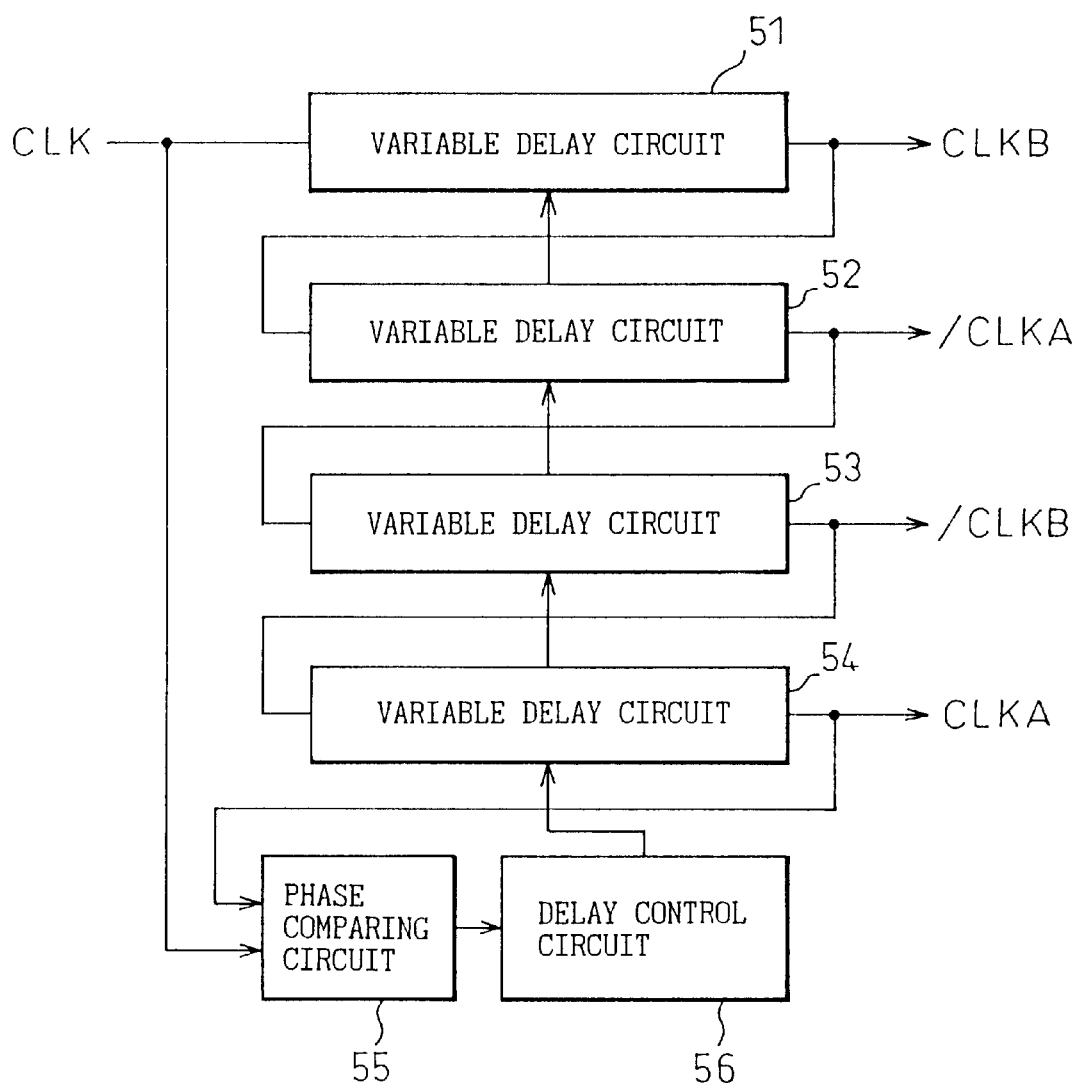
FIG. 10 is a diagram that shows the structure of a shift clock generation circuit in the memory device in the second embodiment.
Figure 11:
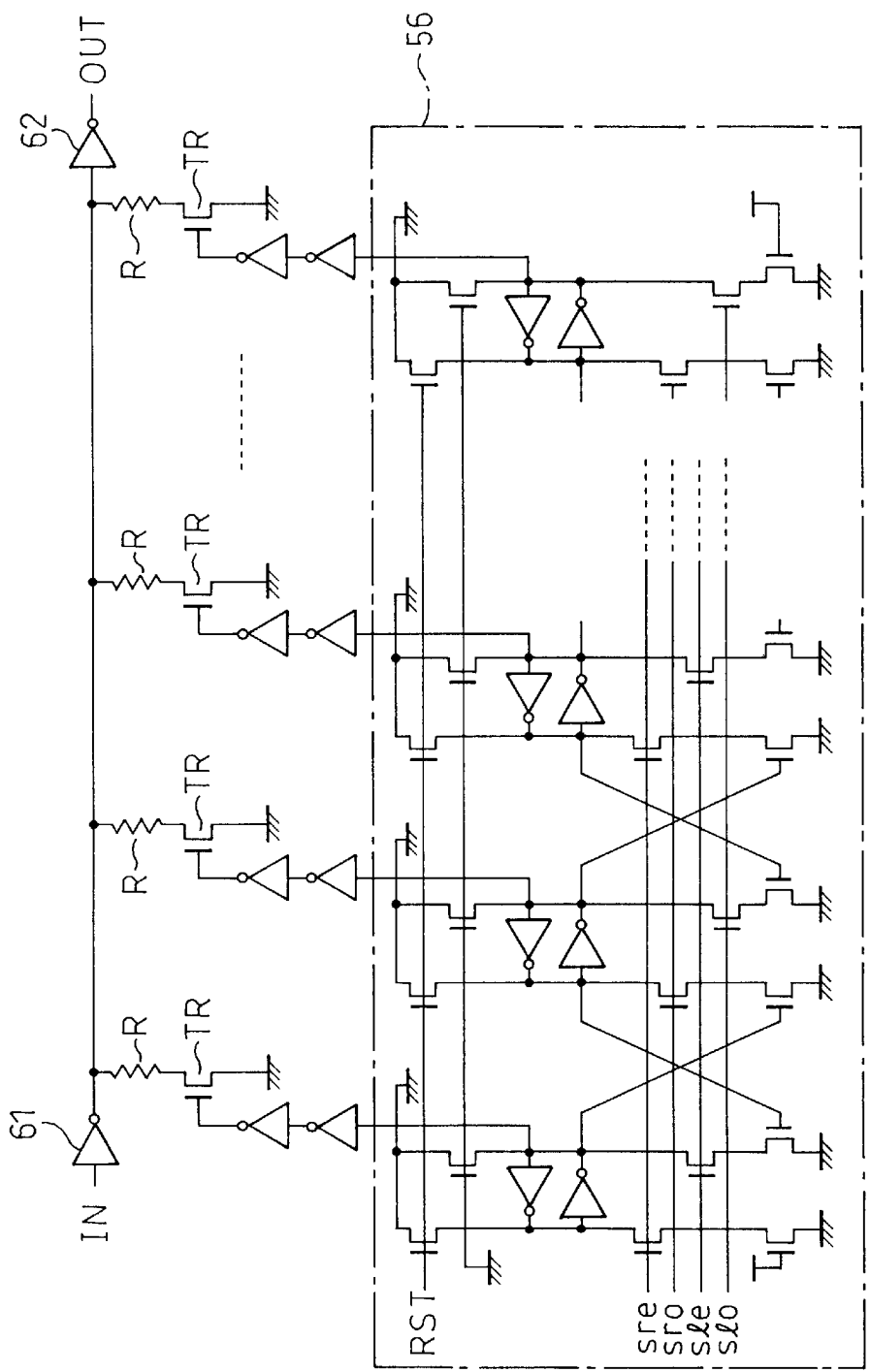
FIG. 11 is a diagram that shows the structure of a variable delay circuit and a delay control circuit in the shift clock generation circuit.

FIG. 10 is a diagram that shows the structure of the shift clock generation circuit 91 and FIG. 11 is a diagram that shows the structure of a variable delay circuit and a delay control circuit. As shown in FIG. 10, the shift clock generation circuit 91 comprises four variable delay circuits 51 to 54 connected in series, a phase comparing circuit 55 and a delay control circuit 56. As shown in FIG. 11, the variable delay circuit comprises an inverter 61 into which an input signal IN is entered and an inverter 62 from which an output signal OUT is output, with plural pairs of resistor and transistor connected to the grounding line in between, and the capacitance of the signal line is adjusted by changing the number of transistors to be turned on to determine the amount of delay of the output signal OUT from the input signal IN. The delay control circuit 56 turns the signals which are on the left side of a certain point into "H" and those which are on the right side into "L", among the signals to be applied to the gate of each transistor in the variable delay circuit, and the position of the point is changed according to the state of control signals sre, sro, sle and slo. In this way, the amount of delay of the variable delay circuit can be adjusted.

In FIG. 10, the external clock CLK is applied to the first-stage variable delay circuit 51, the phase comparing circuit 55 compares the phases of the output of the fourth-stage variable delay circuit 54 and CLK, and outputs the result of comparison to the delay control circuit 56. The delay control circuit 56 maintains the amount of delay of each variable delay circuit when the phases are identical and, when they are not, it changes each variable delay circuit so that the phases are identical. As the four variable delay circuits 51 to 54 are equivalent to each another, when the phases are identical, each variable delay circuit respectively delays the external clock CLK by a quarter phase. As a result, the first-stage variable delay circuit 51 outputs CLKB that is delayed from CLK by a quarter phase, the second-stage variable delay circuit 52 outputs /CLKA that is delayed from CLK by a half phase, the third-stage variable delay circuit 53 outputs /CLKB that is delayed from CLK by a three-quarters phase, and the fourth-stage variable delay circuit 54 outputs CLKA the phase of which is identical to CLK.

In this way, the shift clock generation circuit 91 generates the four clocks CLKA, /CLKA, CLKB and /CLKB, which have the same cycle as the external clock but the phases of which are delayed by a quarter phase (90°) sequentially between neighboring clocks, and supplies them to the first DDR-DRAM 33 and the second DDR-DRAM 43. The output sections 34 and 44 of the first DDR-DRAM 33 and the second DDR-DRAM 43 generate the output signal outez and the output disable signal outdz from the four clocks.

INDUSTRIAL APPLICABILITY

According to the present invention, it is possible to realize a semiconductor memory device that can increase only the data transfer rate while the clock speed of the DDR-DRAM and the internal operation speed remain unchanged, without degrading the yield in manufacturing substantially.

What is claimed is:

1. A semiconductor memory device, having first and second DDR-DRAMS, in a package, that output data with a fixed phase at the leading edge and trailing edge of a clock, the data input/output lines of the first and the second DDR-DRAMs being connected commonly, comprising:
 a clock generation circuit that generates, from an external clock, a first clock having the same frequency and phase as the external clock and a second clock having the same frequency as the external clock but being a quarter phase shifted, supplies the first clock to the first DDR-DRAM as a clock, and supplies the second clock to the second DDR-DRAM as a clock;
 a data output portion, in the first DDR-DRAM, that outputs data respectively for time periods corresponding to a quarter phase from points a fixed phase behind the leading edge and the trailing edge of the first clock and brings a data output circuit into a high impedance state for other time periods; and
 a data output portion, in the second DDR-DRAM, that outputs data respectively for time periods corresponding to a quarter phase from points a fixed phase behind the leading edge and the trailing edge of the second clock and brings a data output circuit into a high impedance state for other time periods.

2. A semiconductor memory device, as set forth in claim 1, wherein the first and the second DDR-DRAMS are formed on the same silicon substrate and are able to operate independently as well as being worked independently.

3. A semiconductor memory device, as set forth in claim 1, wherein the data input/output lines are identical wires formed on the silicon substrate and the identical wires are connected to the data input/output lines of the first and the second DDR-DRAMS via bonding wires.

4. A semiconductor memory device, as set forth in claim 1, wherein the clock generation circuit comprises a delay circuit having four identical variable delay circuits that can change the amount of delay, by being connected in four-stage series, a phase comparing circuit that compares the phase of a delayed clock, which is the external clock delayed in the delay circuit, with that of the external clock, and a delay control circuit that controls the amount of delay in each variable delay circuit according to the results of comparison of the phase comparing circuit so that the delayed clock and the external clock have the same phase.

5. A semiconductor memory device, as set forth in claim 1, wherein the clock generation circuit supplies the second clock to the first DDR-DRAM and the first clock to the second DDR-DRAM, the data output portion of the first DDR-DRAM generates data output control signals from the first and the second clocks, and the data output portion of the second DDR-DRAM generates data output control signals from the first and the second clocks.

* * * * *